(12) United States Patent
Urakawa et al.

(10) Patent No.: US 7,671,147 B2
(45) Date of Patent: Mar. 2, 2010

(54) COMPOSITION OF OXAZOLIDINE EPOXY RESIN, EPOXY PHOSPHAZENE, PHOSPHORUS COMPOUND OR POLYPHENYLENE ETHER AND CURING AGENT

(75) Inventors: Masaaki Urakawa, Yokohama (JP); Takeshi Arai, Kitamoto (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 504 days.

(21) Appl. No.: 11/630,886

(22) PCT Filed: Jun. 28, 2005

(86) PCT No.: PCT/JP2005/011818

§ 371 (c)(1), (2), (4) Date: Dec. 27, 2006

(87) PCT Pub. No.: WO2006/001445

PCT Pub. Date: Jan. 5, 2006

(65) Prior Publication Data

US 2008/0050596 A1 Feb. 28, 2008

(30) Foreign Application Priority Data

Jun. 29, 2004 (JP) .............................. 2004-191548

(51) Int. Cl.
- *B32B 17/04* (2006.01)
- *B32B 27/04* (2006.01)
- *B32B 27/38* (2006.01)
- *C08L 63/00* (2006.01)
- *C08L 63/02* (2006.01)

(52) U.S. Cl. ........................ 525/526; 428/365; 428/413; 525/396

(58) Field of Classification Search ........................ None
See application file for complete search history.

(56) References Cited

U.S. PATENT DOCUMENTS 5,112,932 A * 5/1992 Koenig et al. .................. 528/51
6,797,750 B2 * 9/2004 Taniguchi et al. ............ 523/451

FOREIGN PATENT DOCUMENTS

| JP | 8-127635 | | 5/1996 |
| JP | 2001-316454 | | 11/2001 |
| JP | 2001-316454 | A * | 11/2001 |
| JP | 2001-335676 | | 12/2001 |
| JP | 2003-012765 | | 1/2003 |
| JP | 2003-12765 | A * | 1/2003 |
| JP | 2003-119253 | | 4/2003 |
| JP | 2003-119253 | A * | 4/2003 |

* cited by examiner

*Primary Examiner*—Robert Sellers
(74) *Attorney, Agent, or Firm*—Finnegan, Henderson, Farabow, Garrett & Dunner L.L.P.

(57) ABSTRACT

Disclosed is a flame-retardant epoxy resin composition characterized by containing (A) an epoxy resin containing 0.5-10 equivalent/kg of oxazolidone rings, (B) an epoxy group-containing phosphazene compound, (C) at least one compound selected from the group consisting of phosphates, condensed phosphates, quinone derivatives of phosphine compounds, and polyphenylene ethers, and (D) at least one curing agent selected from the group consisting of guanidine derivatives, phenol novolacs, bisphenol A novolacs, cresol novolacs and naphthol novolacs.

10 Claims, No Drawings

COMPOSITION OF OXAZOLIDINE EPOXY RESIN, EPOXY PHOSPHAZENE, PHOSPHORUS COMPOUND OR POLYPHENYLENE ETHER AND CURING AGENT

TECHNICAL FIELD

The present invention relates to a halogen-free flame-retardant epoxy resin composition having excellent heat resistance, prepreg storage stability and multilayer board flame retardance, a prepreg using the same, and a copper clad laminate formed by laminating the prepreg.

BACKGROUND ART

In the field of electronic device materials, heat-curable resins typically having an epoxy resin as a main component are widely used to improve electrical reliability, such as heat resistance, insulating properties, adhesion and the like. Among such resins, from the perspective of heat resistance, electrical properties and mechanical properties, resins compliant with FR4 grade (NEMA standards) which have a brominated epoxy resin as a base and are designed to have a glass transition temperature (Tg) of 130 to 140° C. are widely used.

However, in recent years, the demands for making electric appliances smaller, lighter and more functional have been increasing, resulting in demands for more highly integrated and more reliable semiconductors and laminates. There is a particular need for a material which can withstand being heated in a connection process using a lead-free solder having a high softening point and the heat generated by the increased integration.

On the other hand, while it has been common to confer an electric appliance, especially a printed wiring board, with flame retardance by using a halogenated compound, it has recently been pointed out that there is a possibility of a tiny amount of dioxins forming if the printed wiring board is strongly heated. While it is yet to be confirmed whether this is true, to prevent in advance environmental problems in case of fire or during heating when recycling, there is a need to ensure flame retardance without the use of a halogenated compound.

Examples of substitute technologies for halogenated compounds include mixing and dissolving a phosphorous-containing compound such as a phosphate or the like into the epoxy resin component, or mixing and dissolving in a metal hydroxide such as aluminum hydroxide or the like. However, in both of these cases a large amount has to be blended in order to ensure flame retardance, which can cause the heat resistance, water resistance and adhesion of the cured resin to deteriorate.

According to research carried out by the present inventors regarding flame retardants which are well known for non-halogen flame retardance, it was discovered that for a high performance printed wiring board which handles high-speed electrical signals, if the added amount of the non-halogen flame retardant is changed, the printed wiring board can no longer function unless the wiring design is changed, because the electrical properties of the entire resin are typically altered by the addition. The amount of a flame must be changed, for example, when the number of wiring layers is increased to improve the functions of a multilayer printed wiring board, which is an important example of a high-performance printed wiring board, thereby increasing the thickness of the printed wiring board. Thus, consideration has to be given to practically important cases.

For example, Patent Document 1 discloses a resin composition comprising an epoxy resin which has an oxazolidone ring and a phosphorous compound such as tris(2,4-di-t-butylphenyl)phosphite. Patent Document 2 discloses a resin composition comprising a phosphazene compound and an epoxy resin such as a phenol novolac epoxy resin or a cresol novolac epoxy resin. However, while these resin compositions satisfy the required standards for heat resistance, they fail to exhibit sufficient flame retardance when the thickness of the laminate increases.

Patent Document 1: JP-A-8-127635
Patent Document 2: JP-A-2001-335676

DISCLOSURE OF THE INVENTION

Problem to be Solved by the Invention

Under such circumstances, it is an object of the present invention to provide a highly-reliable, halogen-free, flame-retardant epoxy resin composition having excellent heat resistance and prepreg storage stability.

Means for Solving the Problem

To resolve the above-described problems, the present inventors focused on the relationship between the thickness of a laminate and the flaming time in flammability tests thereof, thereby discovering that a resin composition having a small degree of change on the flaming time would meet the above-described object even if the thickness of the laminate changed. As a result of continued extensive research, the present inventors arrived at the present invention by introducing an epoxy resin containing oxazolidone rings and an epoxy group-containing phosphazene compound into a flame-retardant epoxy resin composition, together with at least one compound selected from phosphates, condensed phosphates, quinone derivatives of phosphine compounds and polyphenylene ethers, and then further together with a specific curing agent.

That is, the present invention is as follows:

(1) A flame-retardant epoxy resin composition characterized by comprising (A) an epoxy resin comprising 0.5 to 10 equivalents/kg of oxazolidone rings, (B) an epoxy group-containing phosphazene compound, (C) at least one compound selected from the group consisting of a phosphate, a condensed phosphate, a quinone derivative of a phosphine compound and a polyphenylene ether, and (D) at least one curing agent selected from the group consisting of a guanidine derivative, a phenol novolac, a bisphenol A novolac, a cresol novolac and a naphthol novolac.

(2) The epoxy resin composition according to the above (1), wherein component (B) is a linear and/or cyclic phenoxyphosphazene compound, or a polymer of a linear and/or cyclic phenoxyphosphazene compound.

(3) The epoxy resin composition according to the above (1), wherein the total weight of component (B) and component (C) is 25 to 75% of the total weight of component (A), component (B) and component (C), and the weight ratio between component (B) and component (C) is 20:80 to 50:50.

(4) The epoxy resin composition according to the above (1), wherein the guanidine derivative as component (D) is dicyandiamide.

(5) The epoxy resin composition according to the above (1), wherein when the component (D) is a guanidine derivative, the weight of the component (D) is 2 to 6% of the total weight of the component (A) and component (B).

(6) The epoxy resin composition according to the above (1), wherein when the component (D) is a novolac, the weight of component (D) is 20 to 60% of the total weight of the component (A) and component (B).
(7) A prepreg characterized in that the epoxy resin composition according to any one of the above (1) to (6) is impregnated in a base material.
(8) A laminate characterized in that the laminate is formed by laminating the prepreg according to the above (7).
(9) A metal clad laminate characterized in that the laminate is formed by laminating the prepreg according to the above (7) with a metal foil.
(10) A multilayer printed wiring board characterized in that the printed writing board is a multilayer laminate of the prepreg according to the above (7) with a metal foil.

Advantages Of The Invention

The composition according to the present invention has the advantages of excellent heat resistance, prepreg storage stability and flame retardance as an epoxy resin composition used for a multilayer board.

BEST MODE FOR CARRYING OUT THE INVENTION

The present invention will now be described in more detail.

In the present invention, the (A) epoxy resin containing oxazolidone rings (hereinafter referred to as component (A)) preferably contains 0.5 to 10 equivalents/kg of oxazolidone rings, and more preferably contains 0.5 to 5 equivalents/kg of oxazolidone rings. It is preferable to contain at least 0.5 equivalents/kg of oxazolidone rings because rigidity and heat resistance can be exhibited. It is at the same time, preferable to contain not more than 10 equivalents/kg of oxazolidone rings because water resistance can be improved.

The epoxy equivalent of component (A) is preferably 200 to 10,000 g/eq, more preferably 250 to 5,000 g/eq and even more preferably 250 to 2,000 g/eq. An epoxy equivalent of no more than 10,000 g/equivalent is preferable in terms of improving heat resistance and water resistance of the cured product, while an epoxy equivalent of no less than 200 g/eq is preferable in terms of improving rigidity of the cured product.

Further, while component (A) has epoxy groups having an average of one functional group or more per molecule, preferable are epoxy groups having an average of 1.2 to 5 functional groups per molecule and more preferably an average of 1.2 to 3 functional groups per molecule. Epoxy groups having no more than 5 functional groups are preferable because heat resistance and storage stability improve, while those having no less than 1.2 functional groups are preferable because heat resistance improves.

Component (A) can be obtained in its roughly theoretical amount by, for example, reacting a glycidyl compound and an isocyanate compound in the presence of an oxazolidone ring forming catalyst. For example, by reacting a glycidyl compound and an isocyanate compound in the range of equivalent ratio of 1:1.1 to 1:10, an epoxy resin containing oxazolidone rings can be obtained. The equivalent ratio of 1:1.1 to 1:10 range of the glycidyl compound and isocyanate compound is preferable because heat resistance and water resistance can be improved.

Examples of the raw material glycidyl compound used in the production of component (A) include resins consisting of glycidyl ethers, glycidyl esters, glycidyl amines, linear aliphatic epoxides, and alicyclic epoxides.

Examples of glycidyl ethers include bisphenol glycidyl ethers, novolac glycidyl ethers, and alkyl glycidyl ethers. Specific examples of glycidyl ethers include glycidylated compounds of divalent phenols such as bisphenol A, bisphenol F, bisphenol AD, bisphenol S, tetramethyl bisphenol A, tetramethyl bisphenol F, tetramethyl bisphenol AD, tetramethyl bisphenol S, biphenol, and dihydroxynaphthalene. Further examples include tris(glycidyloxyphenyl)alkanes such as 1,1,1-tris(4-hydroxyphenyl)methane, 1,1,1-(4-hydroxyphenyl)ethane, and 4,4-[1-[4-[1-(4-hydroxyphenyl)-1-methylethyl]phenyl]ethylidene]-bisphenol, and glycidylated compounds of amino phenols. Further examples also include glycidylated compounds of novolac such as phenol novolac, cresol novolac, bisphenol A novolac and naphthol novolac.

Examples of glycidyl esters include the diglycidyl ester of hexahydrophthalic acid, the diglycidyl ester of a dimer acid and the like.

Examples of glycidyl amines include tetraglycidyl diamino diphenyl methane, triglycidyl-paraaminophenol, triglycidyl-metaaminophenol and the like.

Examples of linear aliphatic epoxides include epoxidized polybutadiene, epoxidized soybean oil and the like.

Examples of alicyclic epoxides include 3,4-epoxy-6-methylcyclohexyl carboxylate, 3,4-epoxycyclohexyl carboxylate and the like. These raw material glycidyl compounds may be used alone or in combination of two or more thereof.

Examples of the raw material isocyanate compound used for obtaining the component (A) resin include, but are not limited to, bifunctional isocyanate compounds such as methane diisocyanate, butane-1,1-diisocyanate, ethane-1,2-diisocyanate, butane-1,2-diisocyanate, trans-vinylene diisocyanate, propane-1,3-diisocyanate, butane-1,4-diisocyanate, 2-butene-1,4-diisocyanate, 2-methylbutene-1,4-diisocyanate, 2-methylbutane-1,4-diisocyanate, pentane-1,5-diisocyanate, 2,2-dimethylpentane-1,5-diisocyanate, hexane-1,6-diisocyanate, heptane-1,7-diisocyanate, octane-1,8-diisocyanate, nonane-1,9-diisocyanate, decane-1,10-diisocyanate, dimethylsilane diisocyanate, diphenylsilane diisocyanate, ω,ω'-1,3-dimethylbenzene diisocyanate, ω,ω'-1,4-dimethylbenzene diisocyanate, ω,ω'-1,3-dimethylcyclohexane diisocyanate, ω,ω'-1,4-dimethylcyclohexane diisocyanate, ω,ω'-1,4-dimethylnaphtalene diisocyanate, ω,ω'-1,5-dimethylnaphtalene diisocyanate, cyclohexane-1,3-diisocyanate, cyclohexane-1,4-diisocyanate, dicyclohexylmethane-4,4'-diisocyanate, 1,3-phenylene diisocyanate, 1,4-phenylene diisocyanate, 1-methylbenzene-2,4-diisocyanate, 1-methylbenzene-2,5-diisocyanate, 1-methylbenzene-2,6-diisocyanate, 1-methylbenzene-3,5-diisocyanate, diphenyl ether-4,4'-diisocyanate, diphenyl ether-2,4'-diisocyanate, naphthalene-1,4-diisocyanate, naphthalene-1,5-diisocyanate, biphenyl-4,4'-diisocyanate, 3,3'-dimethylbiphenyl-4,4'-diisocyanate, 2,3'-dimethoxybiphenyl-4,4'-diisocyanate, diphenylmethane-4,4'-diisocyanate, 3,3'-dimethoxydiphenylmethane-4,4'-diisocyanate, 4,4'-dimethoxydiphenylmethane-3,3'-diisocyanate, diphenyl sulfite-4,4'-diisocyanate, and diphenyl sulfone-4,4'-diisocyanate; multifunctional isocyanate compounds such as polymethylene polyphenyl isocyanate, triphenylmethane triisocyanate, tris(4-phenyl isocyanate thiophosphate)-3,3',4,4'-diphenylmethane tetraisocyanate and the liked multimers, such as dimers or trimers, of the above-described isocyanate compounds; block isocyanate and bisurethane compounds which have been masked with an alcohol or phenol and the like. These isocyanate compounds may be used alone or in combination of two or more thereof.

Preferable among the above-described raw material isocyanate compound for the component (A) resin are bi- or tri-functional isocyanate compounds, and more preferable are bifunctional isocyanate compounds. This is because if the number of functional groups on the isocyanate compound is too large, storage stability decreases, while if the number is too low, heat resistance is not exhibited. Among these, easily-available isocyanate compounds represented by the below formula (1) or (2) are good.

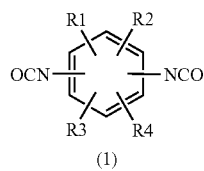

[Formula 1]

(wherein R1 to R4 are each independently a hydrogen atom or an alkyl group having 1 to 4 carbons.).

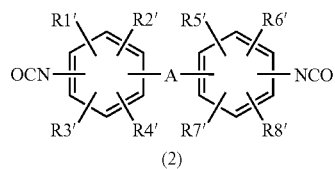

[Formula 2]

(wherein R1' to R8' are each independently a hydrogen atom or an alkyl group having 1 to 4 carbons; and A denotes a single bond, —CH$_2$—, —C(CH$_3$)$_2$, —SO$_2$—, —SO—, —CO—, —S—, or —O—.)

Production of the component (A) resin can be conducted, for instance, in the presence of an oxazolidone ring forming catalyst. Preferable examples of an oxazolidone ring forming catalyst are catalysts which selectively allow formation of oxazolidone ring in the reaction of a glycidyl compound and an isocyanate compound. Examples of catalysts which form an oxazolidone ring in such reaction include, but are not limited to, lithium compounds such as lithium chloride, butoxy lithium and the like; complex salts of boron trifluoride; quaternary ammonium salts such as tetramethylammonium chloride, tetramethylammonium bromide, tetramethylammonium iodide and the like; tertiary amines such as dimethylaminoethanol, triethylamine, tributylamine, benzyldimethylamine, N-methylmorpholine and the like; phosphines such as triphenylphosphine and the like; phosphonium compounds such as allyltriphenylphosphonium bromide, diallyldiphenylphosphonium bromide, ethyltriphenylphosphonium chloride, ethyltriphenylphosphonium iodide, tetrabutylphosphonium acetate-acetic acid complexes, tetrabutylphosphonium acetate, tetrabutylphosphonium chloride, tetrabutylphosphonium bromide, tetrabutylphosphonium iodide and the like; the combination of triphenylantimony and iodine; and imidazols such as 2-phenylimidazol, 2-methylimidazol and the like. These may be used alone or in combination of two or more thereof.

The amount used of the oxazolidone ring forming catalyst is in the range of 5 ppm to 2% by weight of the used raw material. Preferably, this amount is 10 ppm to 1% by weight, more preferably 20 to 5,000 ppm, and even more preferably 20 to 1,000 ppm. Such amount is preferable because if the catalyst is no more than 2% by weight, the risk of a drop in insulating properties or moisture resistance caused by the catalyst remaining in the formed resin when employed as a laminate material can be avoided. The amount of catalyst is preferably no less than 5 ppm, because with such amount a drop in the production efficiency for obtaining a given resin can be avoided. To remove the catalyst, the epoxy resin according to the present invention can be filtered using a suitable solvent in which the catalyst essentially does not dissolve.

The production of component (A) can also be carried out in the presence of a suitable solvent which can dissolve the component (A). In the case of using a solvent, preferable examples include inert solvents such as N,N-dimethylformamide, N,N-diethylformamide, N-methyl-2-pyrrolidone, dimethylsulfoxide, methyl ethyl ketone, xylene, toluene, methyl cellosolve, tetrahydrofuran and the like. These may be used alone or in combination of two or more thereof.

In the production of component (A), a predetermined amount of the raw material epoxy resin is charged into a reaction vessel, which is then heated and regulated at a given temperature. Subsequently, the catalyst is charged in after being mixed with water or a suitable solvent. The charging is carried out at a temperature range of from 20 to 200° C., preferably 80 to 200° C. and more preferably 110 to 180° C. Charging the catalyst at a temperature of at least 20° C. is preferable because the reaction between the epoxy groups and secondary alcohol groups in the molecule is promoted until a given reaction temperature is reached, whereby a drop in the epoxy group concentration can be. Charging at a temperature of no more than 200° C. is preferable because the reaction can be prevented from going out of control.

Next, the above-described isocyanate compound is dropped in stages or continuously all at once or broken up into several times. The dropping time is preferably carried out over 1 to 10 hours, and more preferably over 2 to 5 hours. This is preferable because if the dropping time is less than 1 hour, formation of isocyanurate rings is promoted, while if the dropping time is more than 10 hours, the concentration of epoxy groups drops, so that in either case the qualities and storage stability of the obtained resin deteriorate.

Although the reaction temperature is typically in the range of 20 to 300° C., more preferable is 60 to 250° C., further preferable is 120 to 230° C., even more preferable is 140 to 220° C., and especially preferable is 140 to 200° C. This is preferable because by setting the temperature to be no higher than 300° C., deterioration in the resin can be prevented, while by setting to at least 20° C., the reaction is sufficiently completed, whereby the formation of resin comprising a large amount of undesirable triisocyanurate rings can be prevented, so that in either case the storage stability and water resistance of the obtained resin are improved.

During production of the component (A) with a glycidyl compound and an isocyanate compound, a phenolic compound may be added. Examples of the phenolic compound include bisphenol A, bisphenol F, bisphenol AD, bisphenol S, tetramethyl bisphenol A, tetramethyl bisphenol F, tetramethyl bisphenol AD, tetramethyl bisphenol S, biphenol, dihydroxynaphthalene, tris(glycidyloxyphenyl)alkanes such as 1,1,1-tris(4-hydroxyphenyl)methane, 1,1,1-(4-hydroxyphenyl)ethane, and 4,4-[1-[4-[1-(4-hydroxyphenyl)-1-methylethyl]phenyl]ethylidene]bisphenol, amino phenols, phenol novolac, cresol novolac, bisphenol A novolac and naphthol novolac. These may be added alone or in combination of two or more thereof.

The hydrolyzable chlorine content in component (A) is preferably not more than 500 ppm, more preferably not more than 200 ppm, even more preferably not greater than 100 ppm, especially preferably not greater than 50 ppm, and most preferably not greater than 30 ppm. This reason for this is that if the amount of hydrolyzable chlorine in component (A) is not more than 500 ppm, the metal wiring used in the wiring board is not corroded, whereby a drop in insulating properties can be prevented.

"Hydrolyzable chlorine content" in the present-invention is determined as follows: 3 g of a sample is dissolved in 25 ml of toluene, then 20 ml of a 0.1 N KOH-methanol solution is added to the resultant mixture. This solution is boiled for 15 minutes and subjected to silver nitrate titration. In the same manner, the sample is dissolved in toluene, and then titered as-is with silver nitrate. The inorganic chlorine content obtained by titration is subtracted from the former titration value to determine the hydrolyzable chlorine content.

The content of α-glycol groups in component (A) is preferably not more than 100 meq/kg, more preferably not more than 50 meq/kg, even more preferably not more than 30 meq/kg, and especially preferably not more than 20 meq/kg. This is preferable because if the content of the α-glycol groups is not more than 100 meq/kg, a drop in water resistance can be prevented.

The "α-glycol content" in the present invention is determined by dissolving 3 g of a sample in 25 ml of chloroform, charging the mixture with 25 ml of a benzyltrimethylammonium periodate solution, and reacting the resultant solution for 2.5 hours. The solution is then charged with 5 ml of aqueous 2 N sulfuric acid and 15 ml of a 20% potassium iodide aqueous solution, followed by dropping with a 0.1 N sodium thiosulfate solution, whereby the value was determined.

The ratio of the absorbency at an isocyanurate ring-derived wavenumber of 1,710 cm$^{-1}$ by infrared spectrophotometry to the absorbency at an oxazolidone ring-derived wavenumber of 1,750 cm$^{-1}$ of the component (A) is preferably defined at a value not greater than 0.1. This is preferable because if the above-described infrared spectrophotometry intensity ratio is not greater than 0.1, storage stability and water resistance improve.

It is also preferable for unreacted raw material glycidyl compound to remain in component (A). Further, it is preferable for this unreacted glycidyl compound to be a monomer component. For the case of bisphenol A diglycidyl ether, the term "monomer component" refers to a component wherein in the below formula (3) n=0.

[Formula 3]

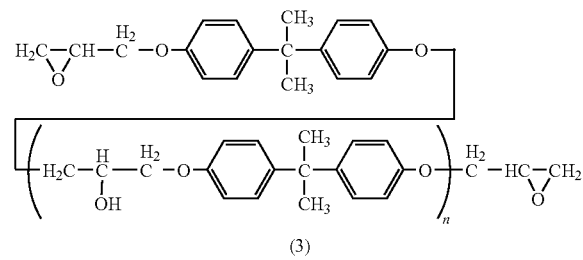

(3)

(wherein n denotes 0 or a positive integer.)

In the component (A), the raw material glycidyl compounds preferably contain 5 to 80% by weight of unreacted monomer component, more preferably 10 to 60% by weight, even more preferably 15 to 50% by weight, and especially preferably 20 to 40% by weight. This is preferable because if the content is at least 5% by weight, the curing reaction can be prevented from being slowed due to the concentration of the glycidyl groups dropping, while if the content is 80% by weight or less, the oxazolidone ring concentration is high, whereby the heat resistance can be improved.

The (B) epoxy group-containing phosphazene compound in the resin composition according to the present invention (hereinafter referred to as component (B)) is at least one compound selected from the group consisting of:

(a) a ring and/or chain phosphazene compound represented by the below formula (4);

(b) a phosphazene polymer polymerized from a ring and/or chain phosphazene compound represented by the below formula (5); and (c) a reaction product having at least one epoxy group from the reaction of the above-described ring and/or chain phosphazene compound with at least one compound selected from the group consisting of an epoxy compound, a phenolic compound, an amino compound and an acid anhydride. These phosphazene compounds may be used alone or in combination of two or more thereof.

[Formula 4]

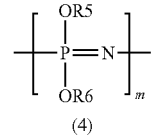

(4)

(wherein R5 and R6 may be the same or different, and represent an alkyl group having from 1 to 18 carbons, a cycloalkyl group having from 5 to 8 carbons, an aryl group having from 6 to 14 carbons, an alkylaryl group having from 7 to 18 carbons, an alkenyl group having from 2 to 18 carbons, an alkenylaryl group having from 8 to 18 carbons, a phenyl group substituted with an amino group, a phenyl group substituted with an aminoalkyl group (wherein the aminoalkyl substituent has 1 to 6 carbons), a phenyl group substituted with a hydroxy group, a phenyl group substituted with a hydroxyalkyl group (wherein the hydroxyalkyl substituent has 1 to 6 carbons), a phenyl group substituted with a glycidyloxy group, or a phenyl group substituted with a glycidyloxyalkyl group (wherein the glycidyloxyalkyl substituent has 4 to 9 carbons); at least one from among "m" R5 and R6 being a phenyl group substituted with a glycidyloxy group or a phenyl group substituted with a glycidyloxyalkyl group (wherein the glycidyloxyalkyl substituent has 4 to 9 carbons); and "m" is an integer of from 3 to 10,000.)

[Formula 5]

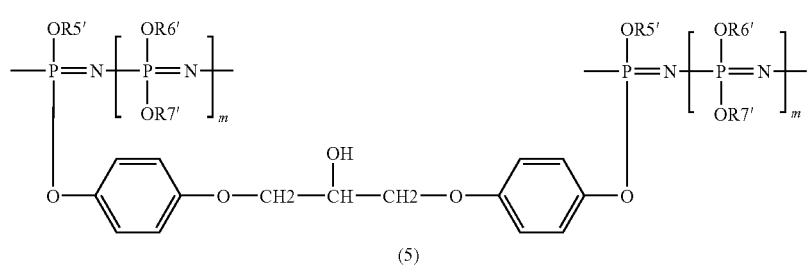

(5)

(wherein R5' and R6' may be the same or different, and represent an alkyl group having from 1 to 18 carbons, a cycloalkyl group having from 5 to 8 carbons, an aryl group having from 6 to 14 carbons, an alkylaryl group having from 7 to 18 carbons, an alkenyl group having from 2 to 18 carbons, an alkenylaryl group having from 8 to 18 carbons, a phenyl group substituted with an amino group, a phenyl group substituted with an aminoalkyl group (wherein the aminoalkyl substituent has 1 to 6 carbons), a phenyl group substituted with a hydroxy group, a phenyl group substituted with a hydroxyalkyl group (wherein the hydroxyalkyl substituent has 1 to 6 carbons), a phenyl group substituted with a glycidyloxy group, or a phenyl group substituted with a glycidyloxyalkyl group (wherein the glycidyloxyalkyl substituent has 4 to 9 carbons); at least one from among "m" R6' and R7' being a phenyl group substituted with a glycidyloxy group or a phenyl group substituted with a glycidyloxyalkyl group (wherein the glycidyloxyalkyl substituent has 4 to 9 carbons); and "m" is an integer of from 3 to 10,000.)

Component (B) can be produced by reacting a hydroxyphosphazene compound in which at least one of the "m" R5 and R6 in formula (4) is a phenyl group substituted with a hydroxy group and/or a hydroxyalkyl group with epichlorohydrin without a solvent or in a suitable solvent such as dimethylformamide in the presence of a quaternary ammonium salt such as tetramethylammonium chloride or an alkali metal hydroxide such as sodium hydroxide, potassium hydroxide or the like.

Examples of compounds which can be used as the (C) component in the resin composition according to the present invention include at least one selected from the group consisting of phosphates, condensed phosphates, quinone derivatives of phosphine compounds, and polyphenylene ethers. These may be used alone or in combination of two or more thereof. It was discovered that in the present invention if the epoxy group-containing phosphazene compound and the above-described component (C) are used together, very high synergistic effects in terms of flame-retarding effect could be obtained. That is, normally, in the case of a glass cloth-reinforced laminate, the more that the thickness is increased by increasing the number of prepreg layers, the longer the flaming time tends to be in a flammability test, although depending on the flame-retarding treatment this is not always the case. However, when the epoxy group-containing phosphazene compound and the above-described component (C) according to the present invention are used together, the change on the flaming time due to the increase in the number of prepreg layers is not as large as when a phosphate compound other than the above-described component (C) is used. As a result, the resin composition according to the present invention is particularly effective in the production of a high performance multilayer printed wiring board which is frequently subjected to design changes to increase the number of wiring layers in order to improve function.

If the degree of change on the flaming time per unit thickness of laminate has an absolute value of 2.5 sec/mm or less, it becomes possible to employ a fixed resin composition even if there is variation in the board thicknesses of the multilayer printed wiring board due to the number of wiring layers being increased or decreased. This is preferable, as changes in wiring design can be avoided. The degree of change on the flaming time preferably has an absolute value of 2.0 sec/mm or less, and most preferably 1.5 sec/mm or less.

The phosphate used in the present invention is represented by general formula (6), the condensed phosphate used in the present invention is represented by general formula (7), the quinone derivative of a phosphine compound used in the present invention is represented by general formula (8) and general formula (9), and the polyphenylene ether used in the present invention is represented by general formula (10).

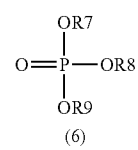

[Formula 6]

(wherein R7, R8 and R9 represent an alkyl group having 6 to 8 carbons.)

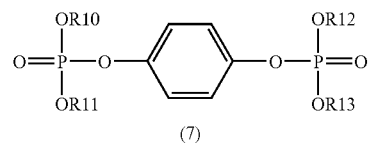

[Formula 7]

(wherein R10, R11, R12 and R13 represent an alkyl group having 6 to 8 carbons or a 2,6-dimethylphenyl group.)

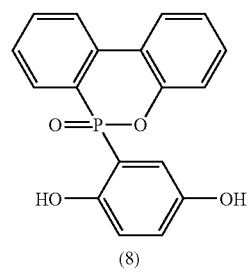

[Formula 8]

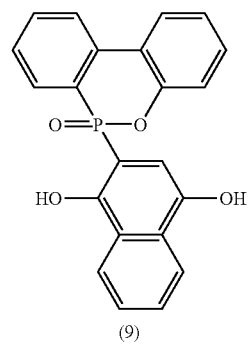

[Formula 9]

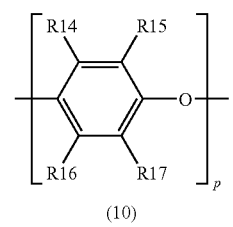

[Formula 10]

(wherein p is an integer of 1 or greater; R14, R15, R16 and R17 represent hydrogen or a hydrocarbon group having 1 to 3 carbons, and R14, R15, R16 and R17 may be the same or different, although in the case of making a metal foil-clad laminate by superimposing a plurality of prepreg sheets and a metal foil and hot-pressing together, or in terms of the flowing properties of the prepreg resin in forming a multi layer laminate of a multilayer printed wiring board, a number average molecular weight is preferably not more than 4,000.)

The amount of the used component (B) and component (C) is preferably such that the total weight of component (B) and component (C) is 25 to 75% of the total weight of component (A), component (B) and component (C), and the weight ratio between component (B) and component (C) is 20:80 to 50:50. The total weight of component (B) and component (C) is preferably no less than 25% of the total weight of component (A), component (B) and component (C) because flame retardance can be ensured without lowering the concentration of the components contributing to flame retarding, and preferably no more than 75% of the total weight of component (A), component (B) and component (C) because the risk of a drop in prepreg storage stability from the concentration of component (A) decreasing, or of a drop in glass transition point (Tg) from the concentration of component (B) and component (C) in the cured product increasing, can be prevented. In addition, the concentration of component (B) is preferably no less than 20% of the weight ratio of component (B) and component (C), because a drop in glass transition point (Tg) can be avoided without a drop in crosslinking density of the cured product, and preferably no more than 50% because flame retardance can be ensured.

Used as the (D) curing agent in the resin composition according to the present invention (hereinafter referred to as component (D)) is at least one compound selected from the group consisting of guanidine derivatives, the compound containing phenolic hydroxyl groups such as phenol novolacs, cresol novolacs, bisphenol A novolacs, and naphthol novolacs. Specific examples of guanidine derivatives include dicyandiamide, dicyandiamide derivatives such as dicyandiamide-aniline adducts, dicyandiamide-methylaniline adducts, dicyandiamide-diaminodiphenylmethane adducts, and dicyandiamide-diaminodiphenyl ether adducts, guanidine salts such as guanidine nitrate, guanidine carbonate, guanidine phosphate, guanidine sulfaminate, and aminoguanidine bicarbonate; acetylguanidine, diacetyl guanidine, propionylguanidine, dipropionylguanidine, cyanoacetylguanidine, guanidine succinate, diethylcyanoacetylguanidine, dicyandiamidine, N-oxymethyl-N'-cyanoguanidine, N,N'-dicarboethoxyguanidine and the like. Among these examples, in terms of heat resistance dicyandiamide is preferable. These guanidine derivatives and novolacs may be used alone or in combination of two or more thereof.

The amount of the component (D) used is, when the component (D) is a guanidine derivative, preferably 2 to 6% by weight of the total weight of the component (A) and component (B). When the component (D) is a novolac, the amount of component (D) is preferably 20 to 60% by weight of the total weight of the component (A) and component (B). The amount of the component (D) is preferably at least 2% when a guanidine derivative (at least 20% for a novolac) by weight of the total weight of the component (A) and component (B) because a drop in Tg can be avoided without a drop in crosslinking density of the cured product, and is preferably not more than 6% when a guanidine derivative (not more than 60% for a novolac) because moisture resistance can be ensured.

In addition to the component (A) resin, component (B) resin, component (C) resin and component (D) resin of the resin composition according to the present invention, epoxy resins having two or more functional groups can be used in a range such that the object of the present invention is not harmed. Examples include, but are not limited to, trifunctional phenol salicylaldehyde novolac type epoxy resins, tetrafunctional tetraphenylolethane type epoxy resins, multifunctional novolac type phenol novolac epoxy resins, cresol novolac epoxy resins, bisphenol A novolac epoxy resins, naphthol novolac epoxy resins and the like. These may be used alone or in combination of two or more thereof.

The resin composition according to the present invention can be used to prepare an epoxy resin varnish by dissolving or dispersing in a solvent. Examples of solvents which can be used include acetone, methyl ethyl ketone, methyl cellosolve, methyl isobutyl ketone, dimethylformamide, propylene glycol monomethyl ether, toluene, xylene and the like.

Preparation of an epoxy resin varnish can also be carried out by blending a curing accelerator into the resin composition according to the present invention. Examples of curing accelerators which can be used include imidazoles, tertiary amines, phosphines, aminotriazoles and the like, which may be used in well known combinations with the curing agent.

A base material may be added to the resin composition according to the present invention to increase mechanical strength and dimensional stability. Examples of base materials which may be used in the present invention include various glass cloths such as rubbing cloth, cloth, chopped mats, and surfacing mats; asbestos cloth, metal fiber cloth and other such synthetic or natural inorganic fiber cloths; woven or non-woven cloths obtained from synthetic fibers such as polyvinyl alcohol fiber, polyester fiber, acrylic fiber, wholly aromatic polyamide fiber and polytetrafluoroethylene fiber; natural fiber cloths such as cotton cloth, hemp cloth and felt; carbon fiber cloths; and natural cellulose cloths such as Kraft paper, cotton paper and paper-glass mixed fiber paper. Each of these may be used alone or in combination of two or more thereof. Further, the base material may also be formed by adding organic and/or inorganic short fibers to the resin composition.

Examples of the method for producing the prepreg according to the present invention include uniformly dissolving or dispersing the resin composition of the present invention and other components as necessary into the above-described solvent or mixed solvent thereof, impregnating the resultant solution into a base material and then drying. When drying, it is preferable for the resin composition to be in a semi-cured state, or so-called "B stage", by regulating the heating level. Impregnation can be carried out by dipping, coating or other such technique. If necessary, the impregnation can be repeated multiple times. The impregnation can also repeated using a plurality of solutions having different compositions or concentrations, to thereby adjust to the ultimately-desired resin composition or resin amount.

The prepreg according to the present invention may use a coupling agent as necessary to improve adhesion at the surface boundary of the resin and the base material. Examples of coupling agents which can be used include common agents such as silane coupling agents, titanate coupling agents, aluminum coupling agents, zircoaluminate coupling agents and the like. The ratio that the base material comprises in the prepreg according to the present invention is, in terms of 100% parts by mass of prepreg, 5 to 90% by mass, preferably 10 to 80% by mass and more preferably 20 to 70% by mass. This is preferable because if the base material comprises at least 5% by mass, the dimensional stability and strength of the composite material after curing is sufficient, while if the base material comprises no more than 90% by mass, dielectric properties and flame retardance of the cured prepreg product are excellent.

The metal clad laminate according to the present invention is produced by laminating and curing a metal foil and the prepreg according to the present invention. The lamination and curing can be conducted at, for example, a temperature of 80 to 300° C., a pressure of 0.01 to 100 MPa, in a range of 1 minute to 10 hours, and more preferably at a temperature of 120 to 250° C., a pressure of 0.1 to 10 MPa, in a range of 1 minute to 5 hours.

Examples of the metal foil used in the metal-clad laminate according to the present invention include copper foil, aluminum foil, tin foil and the like. Copper foil is especially preferable. The foil thickness is not especially limited, but is preferably in a range of 5 to 200 μm and more preferably 5 to 105 μm.

The multilayer printed wiring board according to the present invention is produced by multilayer lamination of a metal foil and the prepreg according to the present invention.

EXAMPLES

The present invention will now be described in more detail with reference to the following Production Examples, Examples and Comparative Examples. Here, the terms "parts" and "%" refer to "parts by weight" and "% by weight".

Production Example 1

One hundred parts of bisphenol A epoxy resin (epoxy equivalent 189 g/eq) were charged with 0.04 parts of tetrabutylammonium bromide. The resultant solution was heated under stirring to an internal temperature of 175° C. The solution was further charged over 120 minutes with 16.1 parts of Coronate T-80™ (TDI, manufactured by Nippon Polyurethane Industry Co., Ltd.; approximately 80% 2,4-tolylenediisocyanate, approximately 20% 2,6-tolylenediisocyanate). Once this had been charged, the resultant solution was stirred for 4 hours while maintaining the reaction temperature at 175° C., to thereby obtain the oxazolidone ring-containing epoxy resin I.

Production Example 2

One hundred parts of bisphenol A epoxy resin (epoxy equivalent 189 g/eq) were charged with 0.04 parts of tetrabutylammonium bromide. The resultant solution was heated under stirring to an internal temperature of 175° C. The solution was further charged over 120 minutes with 30.9 parts of MR-200™ (diphenylmethane diisocyanate manufactured by Nippon Polyurethane Industry Co., Ltd.). Once this had been charged, the resultant solution was stirred for 4 hours while maintaining the reaction temperature at 175° C., to thereby obtain the oxazolidone ring-containing epoxy resin II.

The characteristics of the oxazolidone ring-containing epoxy resins I and II are shown in Table 1. In Table 1, "n=0 component" means the unreacted monomer component in the raw material bisphenol A type epoxy resin.

Production Example 3

A 2-liter, four-necked flask equipped with a reflux condenser, a thermometer, a stirrer and a dropping funnel was charged with 116 g of a mixture consisting of hexachlorocyclotriphosphazene and octachlorocyclotetraphosphazene (82% hexachlorocyclotriphosphazene and 18% octachlorocyclotetraphosphazene) (1 unit mole, wherein $NPCl_2$ serves as 1 unit) and 200 ml of THF, to thereby obtain a solution. Next, a separately-prepared solution of a sodium salt of 4-methoxyphenol in THF (126.5 g of 4-methoxyphenol (1.1 mole), 23 g of sodium (1 g-atom) and 400 ml of tetrahyfrofuran) was dropped over 1 hour while stirring into the above-described solution of hexachlorocyclotriphosphazene in THF. Since the resulting reaction vigorously generated heat, the reaction was carried out by appropriately cooling so that the reaction temperature did not exceed 30° C. After dropping was finished, the reaction was continued under stirring for another 6 hours at 60° C.

The amount of partially substituted residual chlorine obtained from this reaction was 17.17%, and the estimated structure of such compound was $[NPCl_{0.99}(OC_6H_4CH_3)_{1.01}]_{3.4}$. Next, a separately-prepared solution of a sodium salt of p-cresol in THF (140.6 g of p-cresol (1.3 mole), 28.8 g of sodium (1.2 mole) and 400 ml of THF) was dropped over 1 hour while cooling to control the reaction temperature so as not to exceed 30° C. The reaction was subsequently completed by reacting for 5 hours at room temperature and then for 3 hours at reflux temperature. After the reaction was completed, the solvent THF was removed by evaporation under reduced pressure. The resultant mixture was then charged with 1 liter of toluene to redissolve the product, and this solution was then washed with 500 ml of water for fractionation. The organic layer was washed once with 5% sodium hydroxide aqueous solution and once with 2% sodium hydroxide aqueous solution, then washed once with aqueous (1+9) hydrochloric acid, further washed once with 5% sodium bicarbonate water, and finally washed twice with water, whereby the water layer was made neutral.

The organic layer was then separated out and dewatered with anhydrous magnesium sulfate. Toluene was removed by evaporation, whereby 270.0 g of a yellow oily product was obtained (98% yield). The residual chlorine content was no more than 0.01%. 247.9 g (0.9 unit moles) of cyclophosphazene obtained by the above-described method on which both 4-methoxyphenoxy groups and 4-methylphenoxy groups were mixedly substituted and 1040.0 g (0.9 moles) of pyridine hydrochloride were charged into a 2-liter, four-necked flask. The temperature was gradually raised, and a reaction was carried out at 205 to 210° C. for 1 hour. After allowing to cool to room temperature, 300 ml of water was charged into the solution to dissolve the reaction product and excess pyridine hydrochloride, and a reaction solution having a pH of between 6 and 7 was prepared with 20% sodium chloride aqueous solution. Next, extraction was carried out four times using one liter of ethyl acetate, then the extracted solutions were added together and washed four times with one liter of saturated aqueous sodium sulfate. The organic layer was separated out and dewatered with anhydrous magnesium sulfate, after which the ethyl acetate was removed by evaporation under reduced pressure.

Next, this concentrated product was dissolved in 300 ml of methanol, and the resultant solution was charged into 3 liters of water. A step for causing precipitation was repeated three times. The obtained crystals were dried under reduced pressure, whereby 200.0 g (85% yield) of pale yellow crystals were obtained. The residual chlorine content of the product was not more than 0.01%. A hydroxyl groups (OH, %) assay carried out according to the acetylation method using anhydrous acetic acid and pyridine disclosed in the Bunseki Kagaku Binran (edited by the Japan Society for Analytical Chemistry), Organic Edition, page 316, gave a value of 6.5% (theoretical value 6.6%). $^1H$- and $^{31}P$-NMR analyses were also conducted to confirm synthesis. The estimated structure was $[NP(OC_6H_4CH_3)_{0.99}(OC_6H_4OH)_{1.01}]_{3.4}$. The hydroxyl value of the subject compound was 259 g/eq. 78.4 g (0.3 unit moles) of this hydroxy group-containing phosphazene compound and 277.6 g (3 moles) of epichlorohydrin were charged into a 1-liter reaction vessel equipped with a stirrer, a reflux condenser and a thermometer, and then dissolved under heating.

Next, a 40% sodium hydroxide aqueous solution (sodium hydroxide: 12.0 g, 0.30 mole) was dropped over 60 minutes at 95 to 118° C. To bring the reaction to completion, the solution was reacted for another 15 minutes at the same temperature. Once the reaction was complete, the epichlorohydrin and water were removed by evaporation. The resultant mixture was charged with 1 liter of chloroform and 1 liter of water, and then twice washed with water. The organic layer which had separated was dewatered with anhydrous magnesium sulfate.

The chloroform was removed by evaporation, whereby 87.7 g of a pale yellow solid was obtained (92% yield). $^1$H- and $^{31}$P-NMR analyses were conducted to confirm synthesis. The estimated structure was [NP(OC$_6$H$_4$CH$_3$)$_{0.99}$(OC$_6$H$_4$OGly)$_{1.01}$]$_{3.4}$ ("Gly" representing a glycidyl group). The epoxy equivalent of the subject compound was 315 g/eq.

Production Example 4

One hundred parts of polyphenylene ether having a number average molecular weight of 20,000 (manufactured by Asahi Kasei Chemicals Corporation) and 30 parts of bisphenol A were dissolved under heating into 100 parts of toluene. The resultant solution was charged with 30 parts of benzoyl peroxide, and the solution was stirred for 60 minutes at 90° C. to undergo a redistribution reaction. This resultant solution was further charged with 10 parts of benzoyl peroxide, and stirred for 30 minutes at 90° C. to complete the redistribution reaction. The reaction mixture was charged into 1,000 parts of methanol, whereby a precipitate was obtained. The precipitate was filtered, and the filtered product was washed with 1,000 parts of methanol, whereby polyphenylene ether Y (number average molecular weight of 1,900, 1.7 phenolic hydroxyl groups per molecule) was obtained.

Example 1

As shown in Table 2, an epoxy resin varnish was prepared using 100 parts of the oxazolidone ring-containing epoxy resin I obtained in Production Example 1, 8 parts of the epoxy group-containing phosphazene compound X obtained in Production Example 3, 27 parts of PX 200 and 3.4 parts of dicyandiamide. The varnish was impregnated by coating into a glass cloth (manufactured by Asahi-Schwebel Co., Ltd., Product number 7628, Treatment AS 891AW), and the cloth was dried at 175° C. to thereby obtain a prepreg having a 45% resin content. Copper foil (18 µm in thickness) was placed onto both sides of stacks of this prepreg consisting of 2 plies, 4 plies, 8 plies and 24 plies, and these stacks were subjected to heated pressure lamination under conditions of a temperature of 185° C., pressure of 40 kg/cm$^2$, and time of 60 minutes, whereby laminates clad with copper foil on both sides were obtained. A sample piece for measuring solder heat resistance was obtained by etching one side of the obtained laminates clad with copper foil on both sides, and a sample piece for measuring Tg and flame retardance was obtained by etching both sides of the obtained laminates clad with copper foil on both sides. The results of the flammability test for the laminates were an average flaming time of 0.9 seconds for the 0.4 mm laminate, 1.2 seconds for the 0.8 mm laminate, 1.8 seconds for the 1.6 mm laminate, and 4.5 seconds for the 4.8 mm laminate. The UL94 for all the laminates corresponded to V-0. Further, the degree of change on the flaming time per unit thickness of laminate was 0.8 sec/mm (degree of change between the 0.4 mm laminate and the 0.8 mm laminate), 0.8 sec/mm (degree of change between the 0.8 mm laminate and the 1.6 mm laminate) and 0.8 sec/mm (degree of change between the 1.6 mm laminate and the 4.8 mm laminate). These were all within 2.5 sec/mm, thereby exhibiting a small, and thus good, degree of change. The Tg of the laminates was high at 156° C., and solder heat resistance was good, as no blistering occurred. The prepreg storage stability was good at 95%.

Example 2

As shown in Table 2, a prepreg and laminates were obtained in the same manner as in Example 1, except that PSM 4326 was used in place of dicyandiamide. The results of the flammability test for the laminates were an average flaming time of 0.7 seconds for the 0.4 mm laminate, 1.2 seconds for the 0.8 mm laminate, and 2.0 seconds for the 1.6 mm laminate. The UL94 for all these laminates corresponded to V-0. Further, the degree of change on the flaming time per unit thickness of laminate was 1.3 sec/mm (degree of change between the 0.4 mm laminate and the 0.8 mm laminate), and 1.0 sec/mm (degree of change between the 0.8 mm laminate and the 1.6 mm laminate), which were both small. The Tg of the laminates was high at 152° C., and solder heat resistance was good, as no blistering occurred. The prepreg storage stability was good at 94%.

Example 3

As shown in Table 2, a prepreg and laminates were obtained in the same manner as in Example 1, except that the oxazolidone ring-containing epoxy resin I and ECN 1299 were used together as the epoxy resin. The results of the flammability test for the laminates were an average flaming time of 0.7 seconds for the 0.4 mm laminate, 1.0 second for the 0.8 mm laminate, 1.6 seconds for the 1.6 mm laminate, and 4.9 seconds for the 4.8 mm laminate. The UL94 for all the laminates corresponded to V-0. Further, the degree of change on the flaming time per unit thickness of laminate was 0.8 sec/mm (degree of change between the 0.4 mm laminate and the 0.8 mm laminate), 0.8 sec/mm (degree of change between the 0.8 mm laminate and the 1.6 mm laminate) and 1.0 sec/mm (degree of change between the 1.6 mm laminate and the 4.8 mm laminate), which were all small. The Tg of the laminates was high at 160° C., and solder heat resistance was good, as no blistering occurred. The prepreg storage stability was good at 92%.

Example 4

As shown in Table 2, a prepreg and laminates were obtained in the same manner as in Example 1, except that the oxazolidone ring-containing epoxy resin I and ECN 1299 were used together as the epoxy resin, and PSM 4326 was used in place of dicyandiamide. The results of the flammability test for the laminates were an average flaming time of 0.6 seconds for the 0.4 mm laminate, 1.0 second for the 0.8 mm laminate, and 1.9 seconds for the 1.6 mm laminate. The UL94 for all these laminates corresponded to V-0. Further, the degree of change on the flaming time per unit thickness of laminate was 1.0 sec/mm (degree of change between the 0.4 mm laminate and the 0.8 mm laminate), and 1.1 sec/mm (degree of change between the 0.8 mm laminate and the 1.6 mm laminate), which were both small. The Tg of the laminates was high at 156° C., and solder heat resistance was good, as no blistering occurred. The prepreg storage stability was good at 90%.

Example 5

As shown in Table 2, a prepreg and laminates were obtained in the same manner as in Example 1, except that the oxazolidone ring-containing epoxy resin II obtained in Production Example 2 and EPN 1182 were used together as the epoxy resin. The results of the flammability test for the laminates were an average flaming time of 0.9 seconds for the 0.4 mm laminate, 1.3 seconds for the 0.8 mm laminate, and 2.5 seconds for the 1.6 mm laminate. The UL94 for all these laminates corresponded to V-0. Further, the degree of change on the flaming time per unit thickness of laminate was 1.0 sec/mm (degree of change between the 0.4 mm laminate and the 0.8 mm laminate), and 1.5 sec/mm (degree of change between the 0.8 mm laminate and the 1.6 mm laminate), which were both small. The Tg of the laminates was high at 158° C., and solder heat resistance was good, as no blistering occurred. The prepreg storage stability was good at 92%.

Example 6

As shown in Table 2, a prepreg and laminates were obtained in the same manner as in Example 1, except that the oxazolidone ring-containing epoxy resin I and ECN 1299 were used together as the epoxy resin, and HCA-HQ was used in place of PX 200. The results of the flammability test for the laminates were an average flaming time of 0.8 seconds for the 0.4 mm laminate, 1.2 seconds for the 0.8 mm laminate, and 2.2 seconds for the 1.6 mm laminate. The UL94 for all these laminates corresponded to V-0. Further, the degree of change on the flaming-time per unit thickness of laminate was 1.0 sec/mm (degree of change between the 0.4 mm laminate and the 0.8 mm laminate), and 1.3 sec/mm (degree of change between the 0.8 mm laminate and the 1.6 mm laminate), which were both small. The Tg of the laminates was high at 162° C., and solder heat resistance was good, as no blistering occurred. The prepreg storage stability was good at 92%.

Example 7

As shown in Table 2, the oxazolidone ring-containing epoxy resin I and ECN 1299 were used together as the epoxy resin, and the polyphenylene ether Y obtained in Production Example 4 was used in place of PX 200. A prepreg and laminates were obtained in the same manner as in Example 1, except that the polyphenylene ether was dissolved in 80° C. toluene to prepare the epoxy resin varnish, and the glass cloth was impregnated while maintaining the varnish temperature at 70° C. The results of the flammability test for the laminates were an average flaming time of 1.0 seconds for the 0.4 mm laminate, 1.5 seconds for the 0.8 mm laminate, and 2.6 seconds for the 1.6 mm laminate. The UL94 for all these laminates corresponded to V-0. Further, the degree of change on the flaming time per unit thickness of laminate was 1.3 sec/mm (degree of change between the 0.4 mm laminate and the 0.8 mm laminate), and 1.4 sec/mm (degree of change between the 0.8 mm laminate and the 1.6 mm laminate), which were both small. The Tg of the laminates was high at 164° C., and solder heat resistance was good, as no blistering occurred. The prepreg storage stability was good at 90%.

Comparative Example 1

As shown in Table 3, an epoxy resin varnish was prepared using 100 parts of the oxazolidone ring-containing epoxy resin I obtained in Production Example 1, 143 parts of the epoxy group-containing phosphazene compound X obtained in Production Example 3, 165 parts of PX 200 and 7.5 parts of dicyandiamide. A prepreg and laminates were then obtained in the same manner as in Example 1. The Tg of the laminates was low at 140° C., and solder heat resistance was poor, as blistering occurred.

Comparative Example 2

As shown in Table 3, an epoxy resin varnish was prepared using 12 parts of the oxazolidone ring-containing epoxy resin I obtained in Production Example 1, 88 parts of EPN 1182, 8 parts of the epoxy group-containing phosphazene compound X obtained in Production Example 3, 29 parts of PX 200 and 5.8 parts of dicyandiamide. A prepreg and laminates were then obtained in the same manner as in Example 1. The prepreg storage stability was insufficient at 84%.

Comparative Example 3

As shown in Table 3, an epoxy resin varnish was prepared using 100 parts of the oxazolidone ring-containing epoxy resin I obtained in Production Example 1, 10 parts of the epoxy group-containing phosphazene compound X obtained in Production Example 3, 20 parts of PX 200 and 3.4 parts of dicyandiamide. A prepreg and laminates were then obtained in the same manner as in Example 1. The results of the flammability test for the laminates were an average flaming time of 5.1 seconds for the 0.8 mm laminate, and 10.1 seconds for the 1.6 mm laminate, which corresponded to V-1, and was thus insufficient. Further, the degree of change on the flaming time was 6.3 sec/mm (degree of change between the 0.4 mm laminate and the 0.8 mm laminate), and 6.3 sec/mm (degree of change between the 0.8 mm laminate and the 1.6 mm laminate), which was large.

Comparative Example 4

As shown in Table 3, an epoxy resin varnish was prepared using 35 parts of the oxazolidone ring-containing epoxy resin I obtained in Production Example 1, 65 parts of ECN 1299, 10 parts of the epoxy group-containing phosphazene compound X obtained in Production Example 3, 45 parts of PX 200 and 4.6 parts of dicyandiamide. A prepreg and laminates were then obtained in the same manner as in Example 1. The Tg of the laminates was low at 146° C., and solder heat resistance was insufficient, as blistering occurred.

Comparative Example 5

As shown in Table 3, an epoxy resin varnish was prepared using 35 parts of the oxazolidone ring-containing epoxy resin I obtained in Production Example 1, 65 parts of ECN 1299, 28 parts of the epoxy group-containing phosphazene compound X obtained in Production Example 3, 24 parts of PX 200 and 5.1 parts of dicyandiamide. A prepreg and laminates were then obtained in the same manner as in Example 1. The results of the flammability test for the laminates were an average flaming time of 12.2 seconds for the 1.6 mm laminate, which corresponded to V-1, and was thus insufficient. Further, the degree of change on the flaming time was 6.8 sec/mm (degree of change between the 0.4 mm laminate and the 0.8 mm laminate), and 9.0 sec/mm (degree of change between the 0.8 mm laminate and the 1.6 mm laminate), which was large.

Comparative Example 6

As shown in Table 3, an epoxy resin varnish was prepared using 100 parts of the oxazolidone ring-containing epoxy resin I obtained in Production Example 1, 143 parts of the epoxy group-containing phosphazene compound X obtained in Production Example 3, and 7.9 parts of dicyandiamide. A prepreg and laminates were then obtained in the same manner as in Example 1. The results of the flammability test for the laminates were an average flaming time of 7.5 seconds for the 1.6 mm laminate and 17.2 seconds for the 4.8 mm laminate, which corresponded to V-1, and was thus insufficient. Further, the degree of change on the flaming time was 4.0 sec/mm (degree of change between the 0.4 mm laminate and the 0.8 mm laminate), 6.4 sec/mm (degree of change between the 0.8 mm laminate and the 1.6 mm laminate), and 3.0 sec/mm (degree of change between the 1.6 mm laminate and the 4.8 mm laminate), which were all large.

Comparative Example 7

As shown in Table 3, an epoxy resin varnish was prepared using 100 parts of the oxazolidone ring-containing epoxy resin I obtained in Production Example 1, 8 parts of the epoxy group-containing phosphazene compound X obtained in Production Example 3, 3.5 parts of red phosphorous and 3.4 parts of dicyandiamide. A prepreg and laminates were then obtained in the same manner as in Example 1. The results of the flammability test for the laminates were an average flaming time of 13.6 seconds for the 4.8 mm laminate, which corresponded to V-1, and was thus insufficient. Further, the degree of change on the flaming time was 3.3 sec/mm (degree of change between the 0.4 mm laminate and the 0.8 mm laminate), 3.9 sec/mm (degree of change between the 0.8 mm laminate and the 1.6 mm laminate), and 2.7 sec/mm (degree of change between the 1.6 mm laminate and the 4.8 mm laminate), which were all large.

Comparative Example 8

As shown in Table 3, an epoxy resin varnish was prepared using 100 parts of the oxazolidone ring-containing epoxy resin I obtained in Production Example 1, 32 parts of PX 200, and 3.2 parts of dicyandiamide. A prepreg and laminates were then obtained in the same manner as in Example 1. The results of the flammability test for the laminates were an average flaming time of 5.3 seconds for the 1.6 mm laminate and 14.0 seconds for the 4.8 mm laminate, which corresponded to V-1, and was thus insufficient. Further, the degree on change on the flaming time was 3.3 sec/mm (degree of change between the 0.4 mm laminate and the 0.8 mm laminate), 4.1 sec/mm (degree of change between the 0.8 mm laminate and the 1.6 mm laminate), and 2.7 sec/mm (degree of change between the 1.6 mm laminate and the 4.8 mm laminate), which were all large.

The results for the Examples are shown in Table 2, and those for the Comparative Examples are shown in Table 3.

The respective tests were conducted in accordance with the following procedures.

(Flame Retardance)

Based on the UL94 standard (Test for Flammability of Plastic Materials for Parts in Devices and Appliances, UL94, Fifth Edition), the dimensions of the sample pieces were set at 125 mm in length and 13 mm in width. Using "t1" to represent the flaming time after being brought into contact with a flame for the first time, "t2" to represent the flaming time after being brought into contact with a flame for the second time and "t3" to represent the glowing time after being brought into contact with a flame for the second time, the evaluated criteria were:

V-0:
(1) A flaming time t1 or t2 for each sample piece of not more than 10 seconds.
(2) A sum of the flaming time for each sample piece from all of the treatments (t1+t2 for five sample pieces) of not more than 50 seconds (an average flaming time of not more than 5 seconds).
(3) A sum of the flaming time and the glowing time for each sample piece after being brought into contact with a flame for the second time (t2+t3) of not more than 30 seconds.
(4) No flaming or glowing up to the holding clamp of the respective sample pieces.
(5) No ignition of the cotton indicator from lit substances or dripped matter.

V-1:
(1) A flaming time t1 or t2 for each sample piece of not more than 30 seconds.
(2) A sum of the flaming time for each sample piece from all of the treatments (t1+t2 for five sample pieces) of not more than 250 seconds (an average flaming time of not more than 25 seconds).
(3) A sum of the flaming time and the glowing time for each sample piece after being brought into contact with a flame for the second time (t2+t3) of not more than 60 seconds.
(4) No flaming or glowing up to the holding clamp of the respective sample pieces.
(5) No ignition of the cotton indicator from lit substances or dripped matter.

Tg (Glass Transition Temperature)
DSC method, using a DSC/220C manufactured by Seiko Instruments Inc.

Solder Resistance
Occurrence of blistering or peeling when sample piece was floated in a 260° C. solder bath for 120 seconds with the copper foil face facing down (JIS-C-6481)

Prepreg Storage Stability
Gel time retention rate (%) with respect to the storage start when stored for 3 months under 65% RH at 25° C.

TABLE 1

|  | Epoxy equivalent (g/eq) | Hydrolyzable chlorine (ppm) | α-glycol (meq/kg) | IR strength ratio | n = 0 Component (% by weight) |
|---|---|---|---|---|---|
| Oxazolidone ring-containing epoxy resin I | 334 | 130 | <3 | 0.05 | 28 |
| Oxazolidone ring-containing epoxy resin II | 461 | 125 | <3 | 0.07 | 20 |

TABLE 2

|  | Example 1 | Example 2 | Example 3 | Example 4 | Example 5 | Example 6 | Example 7 |
|---|---|---|---|---|---|---|---|
| (A) Oxazolidone ring-containing epoxy resin I | 100 | 100 | 35 | 35 | — | 35 | 35 |
| (A) Oxazolidone ring-containing epoxy resin II | — | — | — | — | 35 | — | — |
| ECN1299 *1 | — | — | 65 | 65 | — | 65 | 65 |

TABLE 2-continued

|  | Example 1 | Example 2 | Example 3 | Example 4 | Example 5 | Example 6 | Example 7 |
|---|---|---|---|---|---|---|---|
| EPN1182 *2 | — | — | — | — | 65 | — | — |
| (B) Epoxy group-containing phosphazene compound X | 8 | 12 | 12 | 12 | 14 | 17 | 43 |
| Dicyandiamide | 3.4 | — | 4.6 | — | 5.1 | 0.03 | 6.8 |
| PSM4326 *3 | — | 35 | — | 46 | — | — | — |
| (C) PX200 *4 | 27 | 26 | 14 | 25 | 20 | — | — |
| (C) HCA-HQ *5 | — | — | — | — | — | 25 | — |
| (C) Polyphenylene ether Y | — | — | — | — | — | — | 45 |
| ((B) weight + (C) weight)/((A) weight + (B) weight + (C) weight) × 100(%) | 26 | 28 | 43 | 51 | 49 | 55 | 72 |
| ((B) weight)/((B) weight + (C) weight) × 100 (%) | 23 | 32 | 46 | 32 | 41 | 41 | 49 |
| Flame retardance |  |  |  |  |  |  |  |
| Average flaming time (seconds) for the 0.4 mm laminate | 0.9 (V-0) | 0.7 (V-0) | 0.7 (V-0) | 0.6 (V-0) | 0.9 (V-0) | 0.8 (V-0) | 1.0 (V-0) |
| Average flaming time (seconds) for the 0.8 mm laminate | 1.2 (V-0) | 1.2 (V-0) | 1.0 (V-0) | 1.0 (V-0) | 1.3 (V-0) | 1.2 (V-0) | 1.5 (V-0) |
| Average flaming time (seconds) for the 1.6 mm laminate | 1.8 (V-0) | 2.0 (V-0) | 1.6 (V-0) | 1.9 (V-0) | 2.5 (V-0) | 2.2 (V-0) | 2.6 (V-0) |
| Average flaming time (seconds) for the 4.8 mm laminate | 4.5 (V-0) | — | 4.9 (V-0) | — | — | — | — |
| Degree of change on the flaming time (sec/mm, between the 0.4 mm laminate and the 0.8 mm laminate) | 0.8 | 1.3 | 0.8 | 1.0 | 1.0 | 1.0 | 1.3 |
| Degree of change on the flaming time (sec/mm, between the 0.8 mm laminate and the 1.6 mm laminate) | 0.8 | 1.0 | 0.8 | 1.1 | 1.5 | 1.3 | 1.4 |
| Degree of change on the flaming time (sec/mm, between the 1.6 mm laminate and the 4.8 mm laminate) | 0.8 | — | 1.0 | — | — | — | — |
| Tg (DSC) (° C.) | 156 | 152 | 160 | 156 | 158 | 162 | 164 |
| Solder heat resistance (occurrence of blistering or peeling) | No | No | No | No | No | No | No |
| Prepreg storage stability (retention rate %) | 95 | 94 | 92 | 90 | 92 | 92 | 90 |

*1 Cresol novolac type epoxy resin (manufactured by Asahi Kasei Epoxy Co., Ltd., epoxy equivalent of 219 g/eq)
*2 Phenol novolac type epoxy resin (manufactured by Asahi Kasei Epoxy Co., Ltd., epoxy equivalent of 179 g/eq)
*3 Phenol novolac (manufactured by Gunei Chemical Industry Co., Ltd., hydroxyl group equivalent of 106 g/eq)
*4 Condensed phosphate (manufactured by Daihachi Chemical Industry Co., Ltd., phosphorous content of 9.0%)
*5 Quinone derivative of phosphine compound (manufactured by Sanko Chemical Industry Co., Ltd., phosphorous content of 9.6%, hydroxyl group equivalent of 162 g/eq)

TABLE 3

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| (A) Oxazolidone ring-containing epoxy resin I | 100 | 12 | 100 | 35 | 35 | 100 | 100 | 100 |
| (A) Oxazolidone ring-containing epoxy resin II | — | — | — | — | — | — | — | — |
| ECN1299 *1 | — | — | — | 65 | 65 | — | — | — |
| EPN1182 *2 | — | 88 | — | — | — | — | — | — |
| (B) Epoxy group-containing phosphazene compound X | 143 | 8 | 10 | 10 | 28 | 143 | 8 | — |
| Dicyandiamide | 7.5 | 5.8 | 3.4 | 4.6 | 5.1 | 7.9 | 3.4 | 3.2 |
| PSM4326 *3 | — | — | — | — | — | — | — | — |
| (C) PX200 *4 | 165 | 29 | 20 | 45 | 24 | — | — | 32 |
| (C) HCA-HQ *5 | — | — | — | — | — | — | — | — |
| (C) Polyphenylene ether Y | — | — | — | — | — | — | — | — |
| red phosphorous | — | — | — | — | — | — | 3.5 | — |
| ((B) weight + (C) weight)/((A) weight + (B) weight + (C) weight) × 100(%) | 76 | 76 | 23 | 61 | 60 | 59 | 10 | 24 |
| ((B) weight)/((B) weight + (C) weight) × 100 (%) | 47 | 22 | 33 | 18 | 54 | 100 | 70 | 0 |
| Flame retardance |  |  |  |  |  |  |  |  |
| Average flaming time (seconds) for the 0.4 mm laminate | 0.5 (V-0) | 0.8 (V-0) | 2.6 (V-0) | 0.8 (V-0) | 2.3 (V-0) | 0.8 (V-0) | 0.6 (V-0) | 0.7 (V-0) |
| Average flaming time (seconds) for the 0.8 mm laminate | 1.0 (V-0) | 1.3 (V-0) | 5.1 (V-1) | 1.2 (V-0) | 5.0 (V-0) | 2.4 (V-0) | 1.9 (V-0) | 2.0 (V-0) |
| Average flaming time (seconds) for the 1.6 mm laminate | 2.0 (V-0) | 2.4 (V-0) | 10.1 (V-1) | 2.3 (V-0) | 12.2 (V-1) | 7.5 (V-1) | 5.0 (V-0) | 5.3 (V-0) |
| Average flaming time (seconds) for the 4.8 mm laminate | — | — | — | — | — | 17.2 (V-1) | 13.6 (V-1) | 14.0 (V-1) |
| Degree of change on the flaming time (sec/mm, between the 0.4 mm laminate and the 0.8 mm laminate) | 1.3 | 1.3 | 6.3 | 1.0 | 6.8 | 4.0 | 3.3 | 3.3 |
| Degree of change on the flaming time (sec/mm, between the 0.8 mm laminate and the 1.6 mm laminate) | 1.3 | 1.4 | 6.3 | 1.4 | 9.0 | 6.4 | 3.9 | 4.1 |
| Degree of change on the flaming time (sec/mm, between the 1.6 mm laminate and the 4.8 mm laminate) | — | — | — | — | — | 3.0 | 2.7 | 2.7 |
| Tg (DSC) (° C.) | 140 | 164 | 156 | 146 | 158 | 145 | 156 | 155 |

TABLE 3-continued

| | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Solder heat resistance (occurrence of blistering or peeling) | Yes | No | No | Yes | No | No | No | Yes |
| Prepreg storage stability (retention rate %) | 92 | 84 | 94 | 91 | 90 | 92 | 90 | 94 |

*1 Cresol novolac type epoxy resin (manufactured by Asahi Kasei Epoxy Co., Ltd., epoxy equivalent of 219 g/eq)
*2 Phenol novolac type epoxy resin (manufactured by Asahi Kasei Epoxy Co., Ltd., epoxy equivalent of 179 g/eq)
*3 Phenol novolac (manufactured by Gunei Chemical Industry Co., Ltd., hydroxyl group equivalent of 106 g/eq)
*4 Condensed phosphate (manufactured by Daihachi Chemical Industry Co., Ltd., phosphorous content of 9.0%)
*5 Quinone derivative of phosphine compound (manufactured by Sanko Chemical Industry Co., Ltd., phosphorous content of 9.6%, hydroxyl group equivalent of 162 g/eq)

INDUSTRIAL APPLICABILITY

According to the resin composition of the present invention, a laminate or a metal clad laminate can be obtained having a prepreg which is stable over a long time period, a high Tg and excellent solder heat resistance. This prepreg, laminate and metal clad laminate are effective in the production of a multilayer printed wiring board used in a broadband communications device.

The invention claimed is:

1. A flame-retardant epoxy resin composition characterized by comprising (A) an epoxy resin comprising 0.5 to 10 equivalents/kg of oxazolidone rings, (B) an epoxy group-containing phosphazene compound, (C) at least one compound selected from the group consisting of a phosphate, a condensed phosphate, a quinone derivative of a phosphine compound, and a polyphenylene ether, and (D) at least one curing agent selected from the group consisting of a guanidine derivative, a phenol novolac, a bisphenol A novolac, a cresol novolac and a naphthol novolac.

2. The epoxy resin composition according to claim 1, wherein component (B) is a linear and/or cyclic phenoxyphosphazene compound, or a polymer of a linear and/or cyclic phenoxyphosphazene compound.

3. The epoxy resin composition according to claim 1, wherein the total weight of component (B) and component (C) is 25 to 75% of the total weight of component (A), component (B) and component (C), and the weight ratio between component (B) and component (C) is 20:80 to 50:50.

4. The epoxy resin composition according to claim 1, wherein the guanidine derivative as component (D) is dicyandiamide.

5. The epoxy resin composition according to claim 1, wherein when the component (D) is a guanidine derivative, the weight of the component (D) is 2 to 6% of the total weight of the component (A) and component (B).

6. The epoxy resin composition according to claim 1, wherein when the component (D) is a novolac, the weight of component (D) is 20 to 60% of the total weight of the component (A) and component (B).

7. A prepreg characterized in that the epoxy resin composition according to any one of claims 1 to 6 is impregnated in a base material.

8. A laminate characterized in that the laminate is formed by laminating the prepreg according to claim 7.

9. A metal clad laminate characterized in that the laminate is formed by laminating the prepreg according to claim 7 with a metal foil.

10. A multilayer printed wiring board characterized in that the printed wiring board is a multilayer laminate of the prepreg according to claim 7 with a metal foil.

* * * * *